(12) United States Patent
Schierling et al.

(10) Patent No.: US 10,734,800 B2
(45) Date of Patent: Aug. 4, 2020

(54) METHOD FOR PREVENTING A DANGEROUS, HIGHER-FREQUENCY EARTH FAULT CURRENT FOR AN ELECTRICAL DRIVE SYSTEM

(71) Applicant: SIEMENS AKTIENGESELLSCHAFT, Munich (DE)

(72) Inventors: Hubert Schierling, Erlangen (DE); Benno Weis, Hemhofen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/336,748

(22) PCT Filed: Aug. 17, 2017

(86) PCT No.: PCT/EP2017/070816
§ 371 (c)(1),
(2) Date: Mar. 26, 2019

(87) PCT Pub. No.: WO2018/059823
PCT Pub. Date: Apr. 5, 2018

(65) Prior Publication Data
US 2019/0363533 A1 Nov. 28, 2019

(30) Foreign Application Priority Data
Sep. 27, 2016 (EP) ..................................... 16190797

(51) Int. Cl.
*H02H 3/33* (2006.01)
*G01R 31/40* (2020.01)
(Continued)

(52) U.S. Cl.
CPC ............. *H02H 3/337* (2013.01); *G01R 31/40* (2013.01); *G01R 31/50* (2020.01); *G01R 27/18* (2013.01); *H02H 7/12* (2013.01)

(58) Field of Classification Search
CPC ......... H02H 3/337; H02H 3/162; G01R 31/50
See application file for complete search history.

(56) References Cited

U.S. PATENT DOCUMENTS

| 7,233,465 B2 * | 6/2007 | Lee | ........................ H02H 3/027 361/42 |
| 7,663,850 B2 * | 2/2010 | Leppanen | ............ H02H 7/0858 361/43 |

(Continued)

*Primary Examiner* — Scott Bauer
(74) *Attorney, Agent, or Firm* — Haney M. Feiereisen LLC (57) ABSTRACT

A dangerous, higher-frequency (>1 kHz) earth fault current in an electrical drive system operated in an electrical grid and having a power converter and an electrical drive machine can be prevented by producing a common-mode voltage with a defined common-mode voltage component in the power converter at a selected low frequency (<1 kHz); in the event of an earth fault in the electrical drive system, flowing at the selected low frequency a common-mode current component of a common-mode current through a predominantly ohmic conductor-to-earth impedance on the basis of the defined common-mode voltage component; measuring a total common-mode current in one of several current circuits of the electrical drive system; determining from the total current the common-mode current component; and when the common-mode current component reaches a reference value, disconnecting the electrical drive system from the electrical grid.

11 Claims, 4 Drawing Sheets

(51) Int. Cl.
*G01R 31/50* (2020.01)
*G01R 27/18* (2006.01)
*H02H 7/12* (2006.01)

(56) References Cited

U.S. PATENT DOCUMENTS

| | | | | |
|---|---|---|---|---|
| 8,203,346 B2* | 6/2012 | Tilhonen | ................ | G01R 31/50 |
| | | | | 324/509 |
| 8,873,207 B2* | 10/2014 | Dillig | .................... | H01H 83/02 |
| | | | | 324/510 |
| 2018/0241200 A1* | 8/2018 | Hu | ....................... | H02H 1/0007 |

* cited by examiner

METHOD FOR PREVENTING A DANGEROUS, HIGHER-FREQUENCY EARTH FAULT CURRENT FOR AN ELECTRICAL DRIVE SYSTEM

CROSS-REFERENCES TO RELATED APPLICATIONS

This application is the U, S, National Stage of International Application No. PCT/EP2017/070816, filed Aug. 17, 2017, which designated the United States and has been published as International Publication No, WO 2018/059823 and which claims the priority of European Patent Application, Serial No, 16190797.7, filed Sep. 27, 2016, pursuant to 35 U.S.C, 119(a)-(d).

BACKGROUND OF THE INVENTION

The invention relates to a method for preventing a dangerous higher-frequency earth fault current for an electrical drive system which is operated in an electrical grid and has a power converter and an electrical drive machine, and to a fault current protective device for performing the method.

A failure or bridging of conductor-earth insulation due to earth faults in electrical devices, cables or other components of installations, which often also comprise electrical drive systems, can jeopardize the availability of the electrical drive system as a result of fire, for example. If the earth fault is caused by a person contacting an electrical conductor, dangerous earth fault currents can likewise occur which, in the form of unacceptably high contact currents, represent a life-threatening hazard to said person.

In order to protect against such hazards, in addition to solutions such as protective earthing or protective potential equalization, use is also made of fault current protective systems, often also referred to in general terms as residual-current circuit breakers (RCCBs). The purpose of these is to detect dangerous earth fault currents and, at the latest upon reaching limit values which are in part defined by standards or comparable regulatory specifications, to disconnect from the electrical grid that installation part which is jeopardized or hazardous to persons.

Although the cited residual-current circuit breakers are neither suitable nor intended to prevent an earth fault, they do in the event of an earth fault limit the height and the temporal duration of the developing dangerous earth fault current to a level which is not dangerous for persons and/or installations.

If a residual-current circuit breaker or a corresponding fault current protective device is designed for the fire protection of installations, for example, it must be assumed on the basis of fire protection knowledge that fire can break out in the event of an earth fault which has an electrical fault power of 60 W or more and is present over an extended period of time. For the purpose of fire protection in installations, a rated fault current of at most 300 mA is therefore usually stipulated as a limit value before tripping of the residual-current circuit breaker must occur. A rated fault current of 30 mA is usually specified as a limit value for the protection of persons. For specific applications, this limit value is also reduced to 10 mA.

If electrical drive systems comprising in particular frequency converters are used in installations, system-inherent properties of such drive systems often give rise to the difficulty that known residual-current circuit breakers cannot be used or can only be used with significant restrictions.

Such frequency converters often comprise power semiconductor switches which, depending on the operating mode, are switched by means of high switching frequencies greater than 1 kHz, wherein conductor earth capacitances of the electrical drive system, which are present due to the nature of the system, produce earth leakage currents having earth leakage frequencies of the same magnitude. However, the occurrence of these higher-frequency earth leakage currents often causes known residual-current circuit breakers to be tripped and consequently results in the electrical drive system being disconnected from the electrical grid, even though no earth fault is present in the electrical drive system. Such erroneous tripping jeopardizes the availability and hence the operational reliability likewise of the electrical drive system and/or the whole installation.

If the tripping of known residual-current circuit breakers is now restricted to detecting dangerous earth fault currents of low frequency up to e.g. 1 kHz, or if the sensitivity of detection in the higher frequency range is reduced, there remains a high hazard potential for persons and/or machine in respect of the fault current protection for installations comprising a corresponding electrical drive system, since dangerous earth fault currents of higher frequency cannot be detected or cannot be detected with the required degree of reliability.

The object of the invention is now to provide a method and a device for the fault current protection of an electrical drive system, which prevents the occurrence of dangerous higher-frequency earth fault currents more effectively than the known fault current protection and avoids erroneous tripping.

SUMMARY OF THE INVENTION

The invention is based on the insight that fault current protection which meets requirements and is reliable in all operating modes for electrical drive systems that have high-frequency earth leakage currents due to the nature of the system can be realized only unsatisfactorily using known fault current devices. Therefore erroneous tripping can occur in the case of known fault current protective devices because a system-inherent high-frequency earth leakage current which is produced by conductor-earth capacitances due to the nature of the system cannot be reliably distinguished from a dangerous high-frequency earth fault current which occurs due to an earth fault.

According to one aspect of the invention, the object is achieved by a method for preventing a dangerous higher-frequency earth fault current for an electrical drive system which is operated in an electrical grid and has a power converter and an electrical drive machine, which method includes: in a first method step, a common-mode voltage is produced in the power converter, said common-mode voltage having a defined common-mode voltage component at a selected low frequency; in a second method step, in the event of an earth fault in the electrical drive system, a common-mode current component of a common-mode current flows through a predominantly ohmic conductor-earth impedance at the selected low frequency on the basis of the defined common-mode voltage component; in a third method step, a total current of the common-mode current is sensed by means of current sensing in one of several current circuits of the electrical drive system; in a fourth method step, the common-mode current component of the common-mode current at the selected low frequency is determined from the total current by means of a current evaluation; and in a fifth method step, the electrical drive system is disconnected from the electrical grid by means of an electrical switching element if the common-mode current component of the common-mode current at the selected low frequency reaches a reference value.

The power converter, which can be a frequency converter in particular, produces the defined common-mode voltage component at the selected low frequency of the common-mode voltage relative to an earthing or protective conductor potential in such a way that the defined common-mode voltage component corresponds to an expected voltage value, the selected low frequency being known accordingly.

The inventive method advantageously allows the indirect monitoring of the electrical drive system or an occurrence of dangerous high-frequency earth fault currents. In this way, an imminent earth fault can be detected and the disconnection of the electrical drive system from the electrical grid can be initiated even though the dangerous high-frequency earth fault current has not yet started to flow, wherein without the disconnection of the electrical drive system from the electrical grid, the dangerous high-frequency earth fault current would however have started to flow, depending on the operating mode of the power converter.

Electrical components of the electrical drive system, e.g. electrical leads with or without an insulating cover, have capacitive impedances relative to an earthing or protective conductor potential due to conductor-earth capacitances (also known as parasitic capacitances). In these conductor-earth capacitances, the defined common-mode voltage component of the common-mode voltage produced by the power converter gives rise to only a very limited current flow operationally, because the respective impedance of these conductor-earth capacitances is very high at the selected low frequency. This limited current flow is very much smaller (e.g. by a factor of 100) than a rated fault current of e.g. 300 mA, which is prescribed in DIN VDE 0100-482 as a limit value for fire protection of cabling and lead installation in TN and TT systems.

If the earth fault in the electrical drive system now occurs e.g. between the electrical lead and the earthing or protective conductor potential, the common-mode current component of the common-mode current flows proportionally to the common-mode voltage component of the common-mode voltage at the selected low frequency. This proportionality is frequency-independent, because the earth fault has the predominantly ohmic conductor-earth impedance. This applies inter alia to earth faults in the sense of a breakdown of e.g. the insulating cover of the electrical leads to the earthing or protective conductor potential, as well as to earth faults in the sense of causing a conductive connection between e.g. the electrical lead and the earthing or protective conductor potential due to dangerous contacting of the electrical lead by persons.

The common-mode current component of the common-mode current at the selected low frequency is therefore an indicator for deciding whether the dangerous earth fault current can occur as a result of the earth fault. For this purpose, the common-mode current is sensed as a total current by means of the current sensing in one of the current circuits of the electrical drive system, and the common-mode current component of the common-mode current is determined by means of the current evaluation at the low frequency. This determined common-mode current component is compared with the reference value. The reference value can follow rated fault currents, reduced by e.g. a factor of 10, wherein the rated fault currents can be taken from standards or regulatory specifications for the fault current protection in installations with regard to protection of persons (rated fault current e.g. 30 mA) and fire protection (rated fault current e.g. 300 mA). As described above, the disconnection of the electrical drive system from the electrical grid takes place if the determined common-mode current component of the common-mode current reaches the reference value.

Advantageous embodiments of the method are specified in the dependent claims.

In a first advantageous embodiment of the method, both the detection of the dangerous earth fault current, in particular the dangerous higher-frequency earth fault current, and the disconnection of the electrical drive system from the electrical grid take place irrespective of an operationally incidental earth leakage current that flows in the electrical drive system.

In contrast with known residual-current circuit breakers or fault current protective systems, the operationally incidental earth leakage currents, irrespective of their frequency, do not have any influence on the detection and switching out of a dangerous earth fault current by means of the method. Erroneous tripping in electrical drive systems, such as that which occurs in known residual-current circuit breakers due to the power semiconductors which are often operated with high switching frequencies in power converters, is therefore prevented in future.

In a further advantageous embodiment of the method, the higher frequency of the dangerous earth fault current is greater than 1 kHz and the selected low frequency of the defined common-mode voltage component of the common-mode voltage is less than 1 kHz.

Since the common-mode current component of the common-mode current at the low frequency of less than 1 kHz only starts to flow if the defined common-mode voltage component of the common-mode voltage at this low frequency is both produced by the power converter and, due to the earth fault in the electrical drive system, builds up the predominantly ohmic conductor-earth impedance that is characteristic of the earth fault, the reference value is advantageously configured to be significantly lower than for usual rated fault currents as prescribed in known residual-current circuit breakers. Since the reference value can be selected to be lower by e.g. a factor of ten in comparison with the usual rated fault currents, in the event of an earth fault this advantageously allows a more sensitive fault current protection with increased reliability for the protection of persons and fire protection in installations having electrical drive systems. It is thus possible to detect earth faults whose predominantly ohmic conductor-earth impedance is still high-resistance (high-resistance signifies greater than approximately 10 kΩ), and dangerous earth fault currents whose higher frequency greater than 1 kHz can already be verified, wherein dangerous earth fault currents of less than 1 kHz might not yet occur.

Furthermore, the method tolerates operationally incidental earth leakage currents with an earth leakage frequency which corresponds to the higher frequency of the dangerous earth fault current in the event of the earth fault. The power converters used for the electrical drive system are able to retain or extend working points that are critical for the fault current protection, e.g. the switching of the power semiconductors by means of very high switching frequencies, without the fault current protection resulting in erroneous tripping in the future. In addition, use of the method removes the requirement for structural measures to change the conductor-earth capacitances of the electrical drive system (e.g. reinforcing the insulating cover of the electrical conductors), since the initiation of the disconnection of the electrical drive system from the electrical grid is defined solely by the dangerous earth fault current, and not by the operationally incidental earth leakage currents which are comparable in height and frequency.

In a further advantageous embodiment of the method, the selected low frequency is a whole-number multiple of a supply frequency of the electrical grid and is in particular 150 Hz at the supply frequency of 50 Hz.

The choice of the low frequency at 150 Hz as an integer which is three times the supply frequency (50 Hz) for the common-mode voltage component of the common-mode voltage is advantageous because in particular frequency converters as power converters in the electrical drive system can system-inherently produce the common-mode voltage component of the common-mode voltage at 150 Hz relative to the earthing or protective conductor potential. If there is no fault, i.e. without the earth fault occurring, application of this common-mode voltage component of the common-mode voltage at 150 Hz to the conductor-earth capacitances of the electrical drive system cannot cause a correspondingly high common-mode current component of the common-mode current at 150 Hz to flow and approximately reach a height of the reference value, e.g. the rated fault current of 30 mA or 300 mA. A corresponding erroneous tripping of the electrical switching element, which results in the undesired disconnection of the electrical drive system from the electrical grid, is consequently avoided.

In a further advantageous embodiment of the method, the power converter produces the common-mode voltage with the defined common-mode voltage component at the selected low frequency by means of a rectifier and/or by means of an inverter.

Furthermore, it is possible to produce the defined common-mode voltage component of the common-mode voltage at the selected low frequency in a combined triggering of the inverter together with the rectifier. If the rectifier is an uncontrolled rectifier, the defined common-mode voltage component of the common-mode voltage at the low frequency of e.g. 150 Hz is produced system-inherently in accordance with grid-tied processes of commutation, while any low frequency up to 1 kHz can be produced using controlled rectifiers and inverters.

In a further advantageous embodiment of the method, the common-mode voltage is sensed by means of voltage sensing in a direct voltage intermediate circuit as one of the current circuits of the power converter or at a load-side power converter output as another of the current circuits of the power converter, and the defined common-mode voltage component of the common-mode voltage at the selected low frequency is determined by a voltage evaluation.

The reliability of the method depends inter alia on the fact that, in the power converter during live running, the defined common-mode voltage component of the common-mode voltage at the selected low frequency of e.g. 150 Hz relative to the earthing or protective conductor potential must be produced by means of the controlled rectifier and/or of the inverter. As a result of malfunctions in the power converter, it can occur that the defined common-mode voltage component of the common-mode voltage at the selected low frequency here of e.g. 150 Hz is not produced or is not produced sufficiently. A failure of a phase of the electrical grid is also problematic.

It is therefore advantageous to check the defined common-mode voltage component at the selected low frequency here of e.g. 150 Hz, as determined by the voltage evaluation, against an expected value for the defined common-mode voltage component. If the expected value is not evident or is not adequately evident, the electrical drive system is switched to a safe operating state by means of suitable measures.

Exemplary measures would be to output an error report to safety and/or operational control systems of the electrical drive system in conjunction with a pulse cut-off to the power converter, to disconnect the electrical drive system from the electrical grid by means of a mains switch, or to cause a very high-resistance earth fault in order to trip a conventional residual-current circuit breaker which is implemented at the electrical grid upstream of the electrical drive system and is then tripped accordingly and disconnects the electrical grid. All of these measures can be performed individually or in combination.

If moreover the same modulation types are used for the triggering of both controlled rectifier and inverter in the power converter (e.g. a flat-top modulation as a space vector modulation type with discontinuous docking in each case) and if the inverter is also operated at a basic frequency which corresponds to the frequency of the electrical grid, an undesirable operating state can occur in which the inverter at the selected low frequency of 150 Hz produces a common-mode voltage component of a common-mode voltage relative to the earthing or protective conductor potential, which common-mode voltage component has a phase shift of 180° relative to the common-mode voltage component of the common-mode voltage at the selected frequency of 150 Hz as produced by the rectifier.

A danger therefore exists that the common-mode voltage component of the common-mode voltage produced by the inverter compensates for the common-mode voltage component produced by the rectifier at the selected low frequency, such that in the event of an earth fault in e.g. the electrical lead which connects the power converter to the electrical machine, the common-mode current component of the common-mode current at the selected frequency (e.g. 150 Hz here) is undesirably reduced or, in the extreme case, even becomes zero. The common-mode current component of the common-mode current cannot then reach the reference value, even though a dangerous earth fault current is possibly already flowing through the predominantly ohmic conductor-earth impedance.

This undesirable operating state can be avoided. The common-mode voltage sensed by means of the voltage sensing and the common-mode voltage component determined by the voltage evaluation are supplied to the trigger of the inverter, wherein the trigger of the inverter is so designed as to prevent the production of the common-mode voltage component of the common-mode voltage at the selected low frequency of here e.g. 150 Hz with the phase shift of 180°. In addition, the electrical drive system can be switched into a safe operating state by means of the measures described above, in particular if no change is detected after the undesirable operating state is first detected.

In a further advantageous embodiment of the method, the reference value is defined from a value range of 0.1 times a prescribed rated fault current to 1 times the prescribed rated fault current.

The selection of the reference value from the value range advantageously allows improved adjustment of the tripping characteristics of the electrical switching element that effects the disconnection of the electrical drive system from the electrical grid. The tripping characteristics are usually defined by a combination of the time to trip of the electrical switching element and height of the rated fault current, such that the tripping sensitivity can be changed by the additional influence of the prescribed rated fault currents by means of defining the reference value from the value range.

In a further advantageous embodiment of the method, the defined common-mode voltage component at the selected low frequency of the common-mode voltage is produced in such a way that, in the event of an earth fault at the ohmic conductor-earth impedance of less than or equal to 15 kΩ, the common-mode current component which flows at the selected low frequency of the common-mode current reaches the reference value.

The common-mode voltage component which must be produced at the selected low frequency of the common-mode voltage is defined in such a way that the common-mode current component of the common-mode current at the low frequency flowing through the ohmic conductor-earth impedance in the event of the earth fault must start to flow at the level of the reference value up to 15 kΩ. This means in particular that when defining and producing the common-mode voltage component at the selected low frequency of the common-mode voltage, it must also be taken onto consideration that different reference values can be specified, e.g., in respect of the rated fault current of 30 mA for the protection of persons or in respect of the rated fault current of 300 mA for fire protection.

According to another aspect of the invention the object is achieved by a fault current protective device for a method according to the invention, with the fault current protective device having a power converter in which a defined common-mode voltage component of a common-mode voltage at a selected low frequency can be produced, having current sensing by means of which a total current can be sensed in one of several current circuits of an electrical drive system, having a current evaluation by means of which a common-mode current component of a common-mode current at the selected low frequency can be determined from a total current and by means of which the common-mode current component can be compared with a reference value, and having an electrical switching element by means of which the electrical drive system can be disconnected from an electrical grid.

In a first advantageous embodiment of the fault current protective device, the power converter has a rectifier and/or an inverter for producing the defined common-mode voltage component of the common-mode voltage at the selected low frequency.

In a further advantageous embodiment of the fault current protective device, the rectifier is designed as an uncontrolled rectifier or as a controlled rectifier.

In a further advantageous embodiment of the fault current protective device, voltage sensing for sensing the common-mode voltage is arranged in a direct voltage intermediate circuit of the power converter or at a load-side power converter output of the power converter, and voltage evaluation is provided by means of which the defined common-mode voltage component of the common-mode voltage at the selected low frequency can be determined.

A further advantageous embodiment of the fault current protective device has a processor unit with the current evaluation and the voltage evaluation.

Said processor unit is arranged in the power converter or in the rectifier and/or in the inverter of the power converter, wherein the processor unit receives the common-mode voltage that is sensed by the voltage sensing and forwards it to the voltage evaluation for the purpose of determining the defined common-mode voltage component at the selected low frequency, and wherein the processor unit receives the common-mode current that is sensed by the current sensing and forwards it to the current evaluation for the purpose of determining the common-mode current component at the selected low frequency.

The comparison of the common-mode current component of the common-mode current at the selected low frequency with the reference value and the checking of the common-mode voltage component of the common-mode voltage at the selected low frequency, as produced by the rectifier and/or inverter, against an expected voltage value can be performed by means of the processor unit.

In a further advantageous embodiment of the fault current protective device, the processor unit is designed to trigger the controlled rectifier and/or for the inverter.

BRIEF DESCRIPTION OF THE DRAWING

The properties, features and advantages described above in respect of the invention, and the manner in which these are achieved, become clearer and easier to understand in connection with the following description of the exemplary embodiments, these being explained in greater detail with reference to the figures, in which.

DETAILED DESCRIPTION OF PREFERRED EMBODIMENTS

Figure 1:
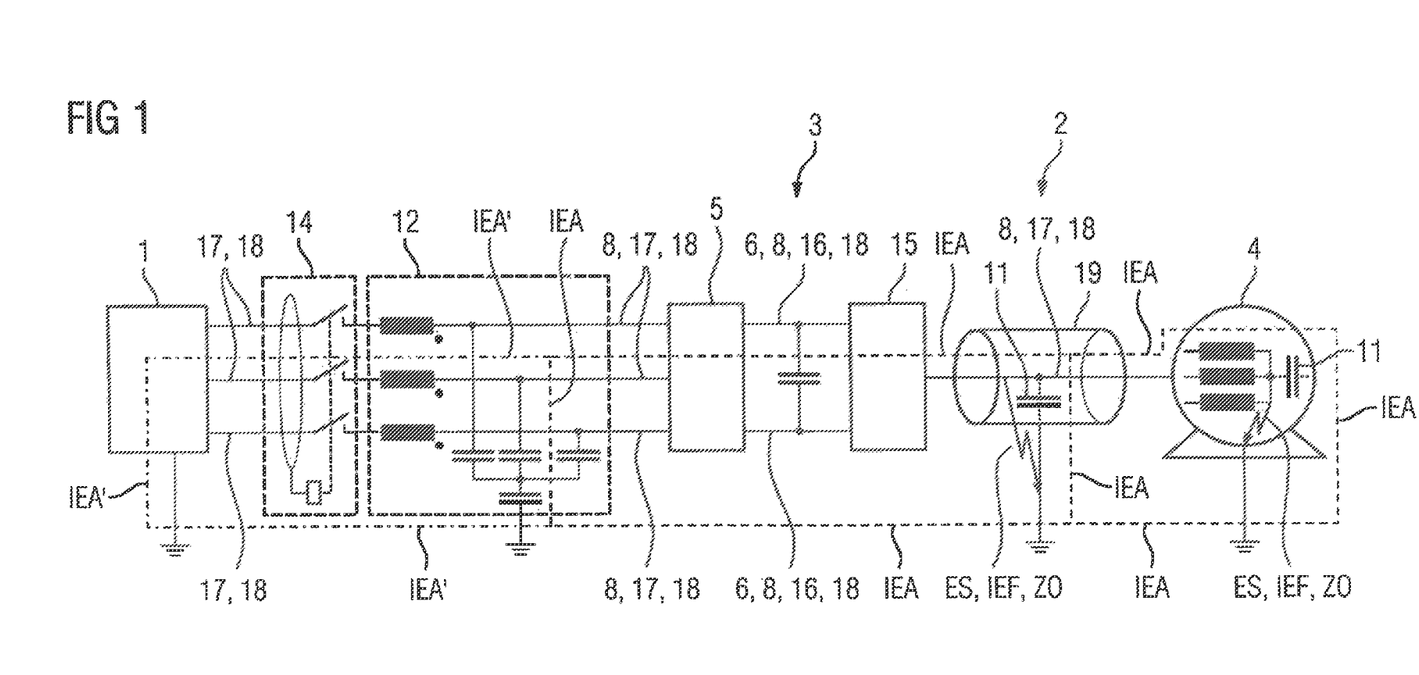
FIG. 1 shows a first schematic illustration of a drive system which is operated in an electrical grid, said drive system having earth leakage currents that occur system-inherently and earth faults that can have dangerous higher-frequency earth fault currents in operation.

FIG. 1 schematically shows earth leakage currents IEA or earth leakage partial currents IEA' and earth faults ES which arise in an operationally incidental manner in an electrical drive system 2 which is operated in an electrical grid 1, wherein dangerous higher-frequency earth fault currents IEF can flow in the electrical drive system 2 in operation as a result of the earth faults ES.

In FIG. 1, the electrical drive system 2 which is operated in the electrical grid 1 has an arrangement of electrical components, wherein an electrical machine 4 which is a three-phase machine is electrically connected to a power converter 3 by means of electrical leads 18 (this electrical lead is illustrated merely schematically in FIG. 1 as suitable for a three-phase system 17). The electrical connection of the power converter 3 to the electrical machine 4 is designed as a three-phase system 17 and includes one of several current circuits 8 of the electrical drive system 2.

The power converter 3 has a rectifier 5 and an inverter 15, wherein the rectifier 5 and the inverter 15 are electrically connected jointly to a direct voltage intermediate circuit 6 by means of electrical leads 18, Such power converters 3 are also referred to as frequency converters with a direct voltage intermediate circuit 6. The electrical connection of the rectifier 5 to the inverter 15 is therefore designed as a direct current system 16 and includes a further of several current circuits 8 of the electrical drive system 2.

The electrical drive system 2 is electrically connected to the electrical grid 1 by means of electrical leads 18 starting from the power converter 3. In this electrical connection, which is designed as a three-phase system 17, between the electrical grid 1 and the power converter 3 of the electrical drive system 2 are connected a residual-current circuit breaker 14 and a network filter 12 which are known from the prior art, wherein the network filter 12 can also be part of the electrical drive system 2.

Conductor-earth capacitances 11 (illustrated in FIG. 1) having an electrical connection to the earthing or protective conductor potential are present during operation, e.g. in both the electrical leads 18 which create the electrical connection between power converter 3 and electrical machine 4, and in the electrical machine 4 itself, for example. The conductor-earth capacitances 11, e.g. of the electrical leads 18, are governed inter alia by their insulating cover 19.

The electrical grid 1 and the network filter 12 are each connected to the earthing or protective conductor potential. Operationally incidental high-frequency earth leakage currents IEA which are system-inherently produced by the power converter 3 of the electrical drive system 2 now flow via the conductor-earth capacitances 11 to the earthing or protective conductor potential, wherein of the operationally incidentally produced high-frequency earth leakage currents IEA, only operationally incidental high-frequency earth leakage partial currents IEA' generally arrive via the earthing or protective conductor potential at the electrical grid 1 and from there via the residual-current circuit breaker 14 back into the electrical drive system 2. A large proportion of the operationally incidentally produced high-frequency earth leakage current IEA is therefore filtered out by the network filter 12.

Known residual-current circuit breakers 14 generally interpret this high-frequency earth leakage partial current IEA' as a dangerous earth fault current IEF, which occurred due to an earth fault ES with predominantly ohmic conductor-earth impedance ZO, e.g. in the electrical lead 18 between the power converter 3 and the electrical machine 4 or even in the electrical machine itself, but which did not occur in this case. This interpretation causes the residual-current circuit breaker 14 to trip, undesirably and abruptly disconnecting the electrical drive system 2 from the electrical grid 1.

Figure 2:
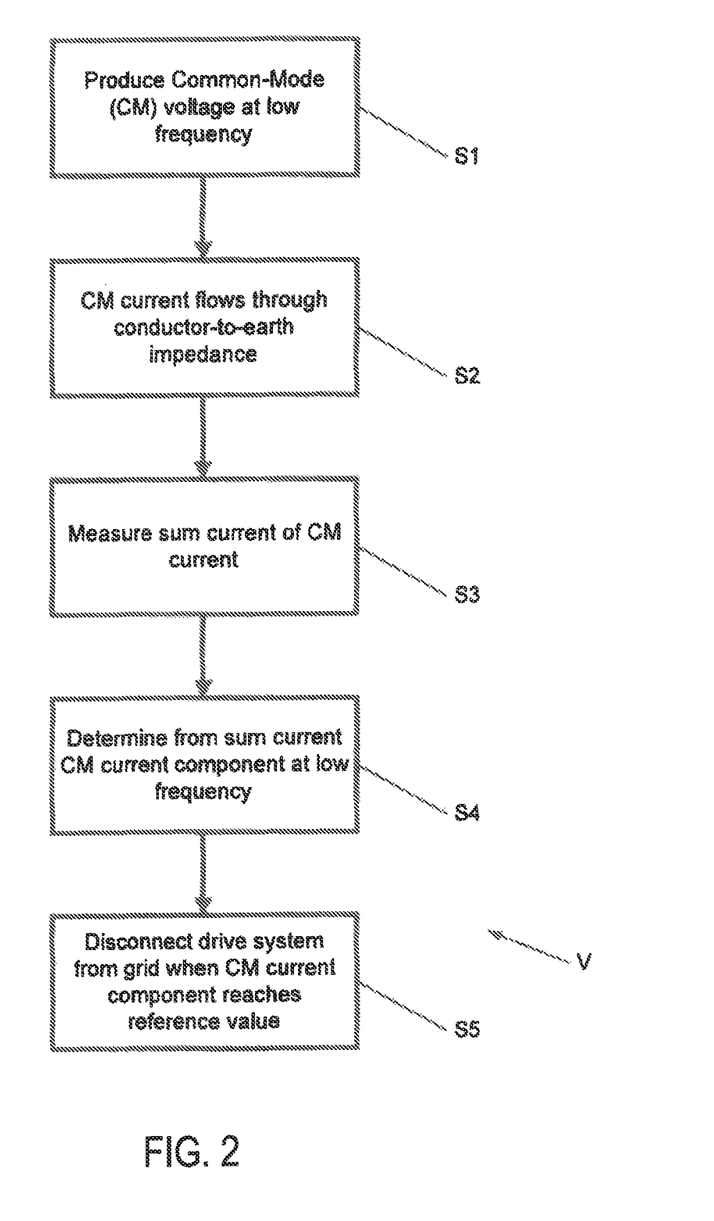
FIG. 2 shows a structure diagram including principal steps of the inventive method for preventing a dangerous higher-frequency earth fault current for an electrical drive system which is operated in an electrical grid and has a power converter and an electrical drive machine as per FIG. 1.

FIG. 2 shows a structure diagram including principal steps of the inventive method V for detecting and switching out a dangerous higher-frequency earth fault current IEF for an electrical drive system 2 which is operated in an electrical grid 1 and comprises a power converter 3 and an electrical drive machine 4 as per FIG. 1.

In a first method step S1 of the method V, a common-mode voltage UCM is produced in the power converter 3, said common-mode voltage UCM having a defined common-mode voltage component UCMA at a selected low frequency. The defined common-mode voltage component UCMA in this case corresponds to an expected voltage value, which is known as a parameter of the method V and/or the production of which can be checked.

In a second method step S2 of the method V, in the event of an earth fault ES in the electrical drive system 2, a common-mode current component ICMA of a common-mode current ICM flows through a predominantly ohmic conductor-earth impedance ZO at the selected low frequency on the basis of the defined common-mode voltage component UCMA.

In a third method step S3 of the method V, a total current IS of the common-mode current ICM is sensed by means of current sensing 7 in one of several current circuits 8 of the electrical drive system 2. In this case, the total current IS can be sensed in each of the current circuits 8 shown by way of example in FIG. 1.

In a fourth method step S4, the common-mode current component ICMA of the common-mode current ICM at the selected low frequency is determined from the total current IS by means of a current evaluation STW.

In a fifth method step S5 of the method V, the electrical drive system 2 is disconnected from the electrical grid 1 by means of an electrical switching element 13 if the common-mode current component ICMA of the common-mode current ICM at the selected low frequency reaches a reference value VW.

The inventive method V therefore ensures that operationally incidental high-frequency earth leakage currents IEA or earth leakage partial currents IEA' no longer have any influence on the detection of earth faults ES in the electrical drive system 2. Irrespective of their frequency, dangerous earth fault currents IEF can therefore be reliably detected, or even prevented before they occur, in the event of the earth fault ES and given the occurrence of operationally incidental high-frequency earth leakage currents IEA or earth leakage partial currents IEA', thereby decisively improving the reliability and tripping sensitivity of the electrical switching element 13.

Figure 3:
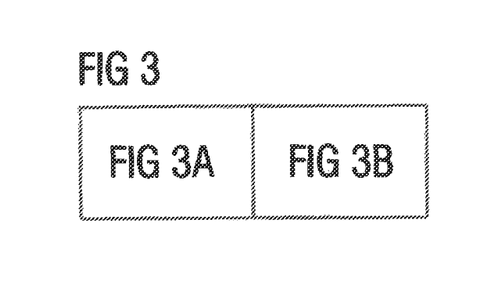
FIG. 3 shows in the partial figures FIG. 3A and FIG. 3B a further schematic illustration as per FIG. 1 with an inventive fault current protective device in the electrical drive system 2 for the inventive method according to FIG. 2.
Figure 3A:
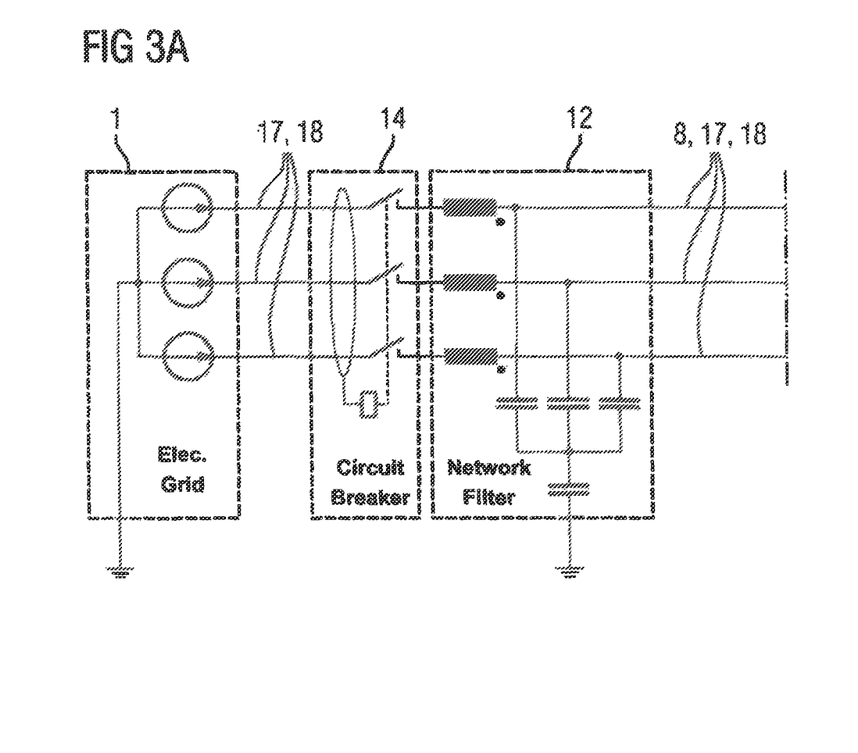
Figure 3B:
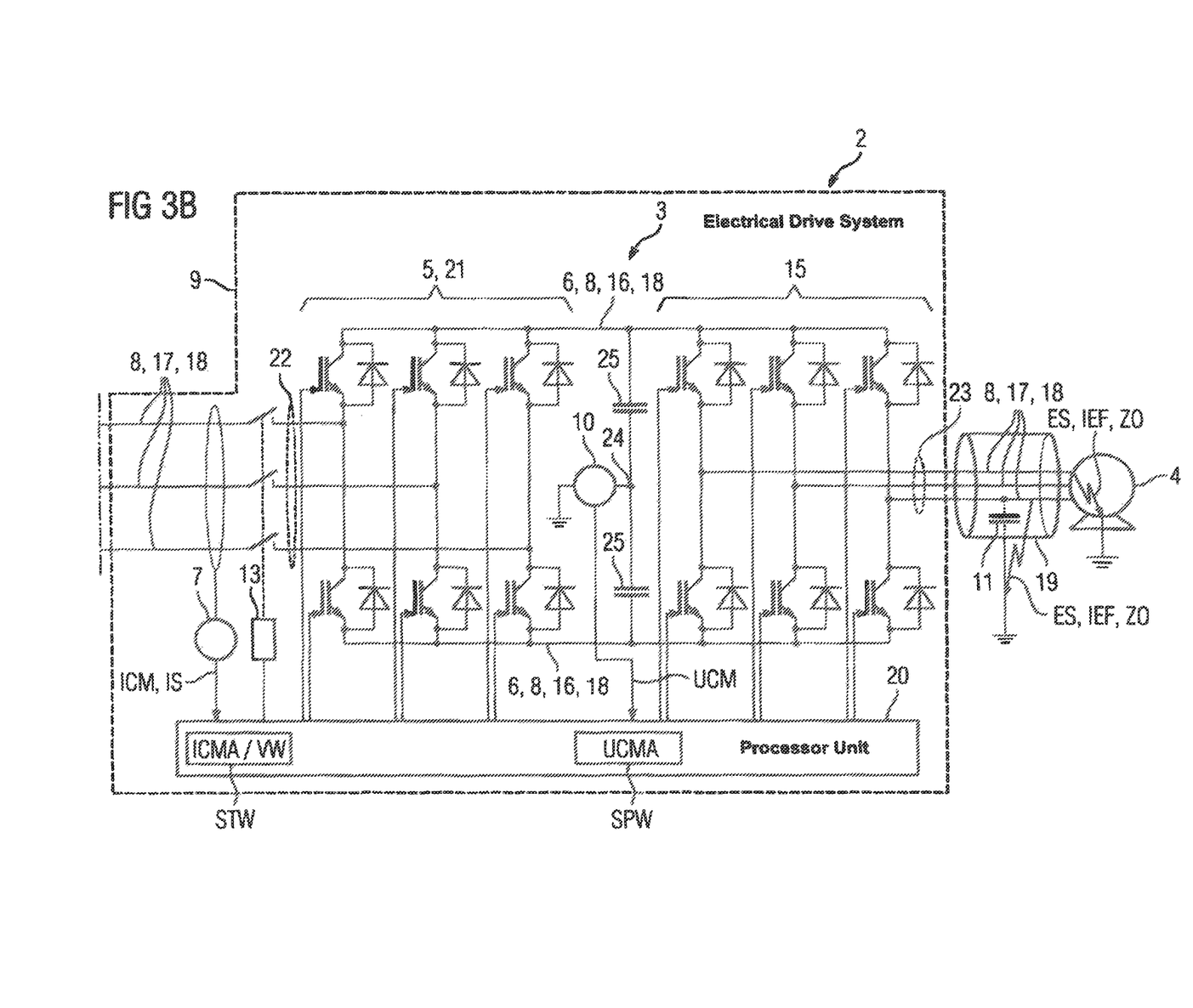

FIG. 3 shows in the partial figures FIG. 3A and FIG. 3B a further schematic illustration as per FIG. 1 with an inventive fault current protective device 9 in the electrical drive system 2 for the inventive method V according to FIG. 2.

The arrangement of the electrical drive system 2 in the electrical grid 1 in FIG. 3 (shown in FIG. 3A and FIG. 3B) corresponds to that in FIG. 1. Furthermore, the electrical drive system 2 has current sensing 7 for sensing a total current IS of a common-mode current ICM. In the exemplary embodiment, the current sensing 7 is arranged in an exemplary manner in one of the several current circuits 8 of the electrical drive system 2 in the three-phase system 17 on the supply side power converter input 22 of the power converter 3. Arrangement of the current sensing 7 in a direct voltage intermediate circuit 6 or at a load-side power converter output 23 of the power converter 3 is likewise possible.

A common-mode current component ICMA at a low frequency is determined from the total current IS of the common-mode current ICM by means of the current evaluation STW, and compared with a reference value VW. If as a consequence of an earth fault ES the comparison finds that the common-mode current component ICMA of the common-mode current ICM at the low frequency reaches the reference value VW, an electrical switching element 13 disconnects the electrical drive system 2 from the electrical grid 1 and prevents a dangerous earth fault current IEF.

In order to ensure that in the event of the earth fault ES the common-mode current component ICMA starts to flow over a predominantly low-resistance conductor-earth impedance ZO, a common-mode voltage UCM with a defined common-mode voltage component UCMA at low frequency is produced in a power converter 3 of the electrical drive system 2 by means of a rectifier 5 and/or an inverter 15. The rectifier 5 illustrated here is configured as a controlled rectifier 21.

In order to check said defined common-mode voltage component UCMA at low frequency against an expected voltage value, the common-mode voltage UCM in the exemplary embodiment according to FIG. 3 (FIG. 3B) is sensed by means of a voltage sensing 10 in the direct voltage intermediate circuit 6. In the case of an arrangement of two direct voltage intermediate circuit capacitors 25 in the direct voltage intermediate circuit 6, the common-mode voltage UCM can advantageously be sensed at a midpoint 24 which is formed between the direct voltage intermediate circuit capacitors 25 relative to the earthing or protective conductor potential. However, the voltage sensing 10 can in principle be arranged in another of the current circuits 8 downstream of the direct voltage intermediate circuit 6 of the power converter 3, e.g. in one of the current circuits 8 which is arranged with the electrical machine 4 as a three-phase system 17 starting from the load-side power converter output 23 of the power converter 3.

The defined common-mode voltage component UCMA at low frequency is determined by means of the voltage sensing SPW, and can be compared with the expected voltage value. If the determined common-mode voltage component UCMA at the low frequency of the common-mode voltage UCM does not reach the expected voltage value, a fault is present in the fault current protective device 9.

In the event of a fault, corresponding measures can be initiated within the electrical drive system 2 or in addition thereto (not shown in FIG. 3), e.g. outputting an error report to safety and/or operational control systems of the electrical drive system 2 in conjunction with a pulse cut-off to the power converter 3, disconnecting the electrical drive system 2 from the electrical grid 1 by means of a mains switch, or causing a very high-resistance earth fault to trip a conventional residual-current circuit breaker 14 which is implemented at the electrical grid 2 upstream of the electrical drive system 2 and which is then tripped accordingly and disconnects the electrical grid 1.

The current evaluation STW and the voltage evaluation SPW are implemented in a processor unit 20 in the exemplary embodiment according to FIG. 3 (FIG. 3B). The processor unit is further designed to trigger both the controlled rectifier 5, 21 and the inverter 15, in order in each case to produce the defined common-mode voltage component UCMA at the low frequency of the common-mode voltage UCM.

The invention claimed is:

1. A method for preventing a dangerous higher-frequency earth fault current with a frequency of greater than 1 kH in an electrical drive system having a power converter and an electrical drive machine and operated in an electrical grid, comprising:
   in a first step:
      producing in the power converter a common-mode voltage having a defined common-mode voltage component at a predefined low frequency of less than 1 kHz,
      measuring the common-mode voltage with a voltage sensing device at one of several current circuits of the electrical drive system at a direct voltage intermediate circuit of the power converter or at another of the current circuits a load-side power converter output, and
      determining with a voltage evaluation device the defined common-mode voltage component of the produced common-mode voltage at the predefined low frequency,
   in a second step:
      in the event of an earth fault in the electrical drive system, flowing at the predefined low frequency through a predominantly ohmic conductor-to-earth impedance a common-mode current component of a common-mode current,
   in a third step:
      measuring with a current sensing device a total current of the common-mode current flowing through one of the several current circuits of the electrical drive system,
   in a fourth step:
      determining with a current evaluation device the common-mode current component of the common-mode current at the predefined to frequency from a total current, and
   in a fifth step:
      disconnecting the electrical drive system from the electrical grid with an electrical switching element, when the common-mode current component of the common-mode current reaches a reference value at the predefined low frequency.

2. The method of claim 1, wherein the dangerous earth fault current, in particular the higher-frequency earth fault current, is detected and the electrical drive system is disconnected from the electrical grid irrespective of an operational earth leakage current flowing in the electrical drive system.

3. The method of claim 1, wherein the predefined low frequency is an integer multiple of a supply frequency of the electrical grid, and is at the supply frequency of 50 Hz in particular 150 Hz.

4. The method of claim 1, wherein the power converter produces the common-mode voltage having the defined common-mode voltage component at the predefined low frequency of less than 1 kHz using a rectifier or an inverter, or both.

5. The method of claim 1, wherein the reference value has a value in a range from 0.1 times a predefined rated fault current to 1 times the predefined rated fault current.

6. The method of claim 1, wherein when the ohmic conductor-to-earth impedance is less than or equal to 15 kΩ, the predefined common-mode voltage component at the predefined low frequency of the common-mode voltage is produced such that the common-mode current component flowing at the predefined low frequency of the common-mode current reaches the reference value.

7. A fault current protective device for preventing a dangerous higher-frequency earth fault current with a frequency of greater than 1 kHz in an electrical drive system operated in an electrical grid and having a power converter configured to produce a defined common-mode voltage component of a common-mode voltage at a predefined low frequency of less than 1 kHz, and an electrical drive machine, said fault current protective device comprising:
   a voltage sensing device arranged at a direct voltage intermediate circuit of the power converter or at a load-side of the power converter;
   a voltage evaluation device configured to determine the defined common-mode voltage component of the common-mode voltage at the predefined low frequency;
   a current sensing device configured to measure a total current in one of several current circuits of the electrical drive system;
   a current evaluation device configured to determine from the total current a common-mode current component of a common-mode current at the predefined low frequency and to compare the common-mode current component with a reference value; and an electrical switching element configured to disconnect the electrical drive system from the electrical grid.

8. The fault current protective device of claim 7, wherein the power converter comprises at least one of a rectifier and an inverter producing the defined common-mode voltage component of the common-mode voltage at the predefined low frequency.

9. The fault current protective device of claim 8, wherein the rectifier is constructed as an uncontrolled rectifier or as a controlled rectifier.

10. The fault current protective device of claim 7, further comprising a processor unit which includes the voltage evaluation device and the current evaluation device.

11. The fault current protective device of claim 10, wherein the power converter comprises at least one of a controlled rectifier and an inverter, and wherein the processor unit is configured to control the controlled rectifier or the inverter, or both.

* * * * *

UNITED STATES PATENT AND TRADEMARK OFFICE
CERTIFICATE OF CORRECTION

PATENT NO. : 10,734,800 B2
APPLICATION NO. : 16/336748
DATED : August 4, 2020
INVENTOR(S) : Hubert Schierling and Benno Weis It is certified that error appears in the above-identified patent and that said Letters Patent is hereby corrected as shown below:

On the Title Page

Under References Cited
[56] US PATENT DOCUMENTS
Add:
--US4896115   01/1990
US2002105765 08/2002
US2013235618 09/2013--

Under [74] Attorney, Agent, or Firm
Replace "Heney" with --Henry--

On page 2, under References Cited
[56] FOREIGN PATENT DOCUMENTS
Add:
--EP1229629   08/2002
EP2568560    03/2012--

In the Claims

In Column 11, Claim 1, Line 49:
Replace "1 kH" with --1 kHz--

In Column 12, Claim 1, Line 6, after "current" add:
--based on the predefined common-mode voltage component,--

Signed and Sealed this
Twenty-ninth Day of September, 2020

Andrei Iancu
*Director of the United States Patent and Trademark Office*